United States Patent [19]

Watkins

[11] Patent Number: 4,661,792
[45] Date of Patent: Apr. 28, 1987

[54] APPARATUS FOR MOUNTING PRINTED CIRCUIT BOARDS

[75] Inventor: Tommy R. Watkins, Plano, Tex.

[73] Assignee: Basler Electric Company, Richardson, Tex.

[21] Appl. No.: 877,176

[22] Filed: Jun. 23, 1986

[51] Int. Cl.⁴ .................... H01F 15/02; H01F 27/30
[52] U.S. Cl. ..................................... 336/65; 336/192; 336/198; 361/412
[58] Field of Search ............... 361/400, 405, 412, 395, 361/413; 336/192, 198, 208, 65

[56] References Cited

U.S. PATENT DOCUMENTS

| 2,639,319 | 5/1953 | Torsch | 336/65 |
| 2,796,590 | 6/1957 | Barnett | 336/65 X |
| 2,800,620 | 7/1957 | Ebbeler et al. | 336/65 X |
| 3,076,165 | 1/1963 | Weyrich | 336/192 X |
| 3,191,135 | 6/1965 | Hazelquist | 336/198 X |
| 3,265,999 | 8/1966 | Kessel | 336/192 |
| 3,281,744 | 10/1966 | Melenson | 336/198 X |
| 3,496,505 | 2/1970 | Johannsen et al. | 336/192 X |

FOREIGN PATENT DOCUMENTS

| 1056659 | 5/1959 | Fed. Rep. of Germany | 336/65 |
| 1906703 | 9/1969 | Fed. Rep. of Germany | 336/198 |
| 76634 | 6/1977 | Japan | 336/198 |
| 1098905 | 1/1968 | United Kingdom | 336/208 |
| 2128814 | 5/1984 | United Kingdom | 336/192 |

Primary Examiner—Thomas J. Kozma
Attorney, Agent, or Firm—Kanz, Scherback & Timmons

[57] ABSTRACT

A transformer having a bobbin adapted for mounting a secondary printed circuit board on a primary printed circuit board is disclosed. Means are provided to electrically connect the primary and secondary printed circuit boards to each other and to the transformer.

2 Claims, 6 Drawing Figures

APPARATUS FOR MOUNTING PRINTED CIRCUIT BOARDS

FIELD OF THE INVENTION

This invention relates generally to printed circuit boards. More particularly, it relates to apparatus for mounting one or more printed circuit boards on another printed circuit board.

BACKGROUND OF THE INVENTION

It is desirable when constructing printed circuit boards to design the location and size of the electrical and electronic components mounted thereon and circuit paths interconnecting the components in as compact a manner as possible. This minimizes material and manufacturing expenses and also reduces the overall size and weight of the printed circuit board. It is also frequently desirable to mount one or more printed circuit boards on another printed circuit board in close proximity thereto, and to interconnect the components and circuits thereon. Conventionally, this is accomplished by attaching one or more non-conductive supporting structures to both of the printed circuit boards and providing separate electrical connections between their respective circuits and components. However, the various supporting fixtures utilized to mount the printed circuit boards together occupy scarce surface space and require that the printed circuit boards be larger and heavier than otherwise might be the case. The use of separate structural elements, extrinsic to the circuits on the printed circuit boards, also increases the material and manufacturing costs of assembling and mounting the printed circuit boards together.

SUMMARY OF THE INVENTION

This invention provides apparatus, including a transformer, for mounting one or more printed circuit boards to a printed circuit board on which the transformer is mounted. The transformer includes a bobbin having first mounting means for mounting the transformer on one of the printed circuit boards and separate mounting means for connecting each of the other printed circuit boards to the transformer bobbin to allow mounting the entire assembly to the first printed circuit board. Means may also be provided to electrically connect the transformer to the printed circuit boards and the various printed circuit boards to each other.

Therefore, it is a primary feature and advantage of this invention to provide an improved apparatus for mounting two or more printed circuit boards together.

It is another feature and advantage of this invention to provide improved apparatus for electrically interconnecting two or more printed circuit boards.

BRIEF DESCRIPTION OF THE DRAWINGS

So that the manner in which the above recited features and advantages of the invention, as well as others which will become apparent to those skilled in the art, are obtained and can be understood in detail, a more particular description of the invention briefly summarized above may be had by reference to the embodiments thereof which are illustrated in the accompanying drawings, which drawings form a part of the specification and in which like numerals depict like parts in the several views. It is noted, however, that the appended drawings illustrate only a preferred embodiment of the invention and are therefore not to be considered limiting of its scope, for the invention may admit to other equally effective embodiments.

DETAILED DESCRIPTION OF THE INVENTION

Figure 1:
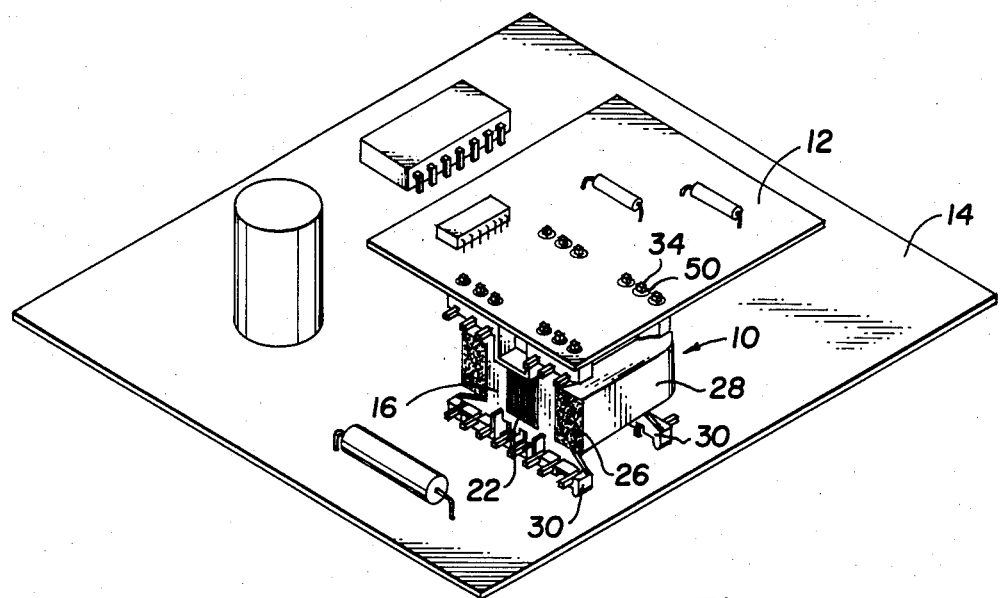
FIG. 1 is a perspective view, partially broken away, of the apparatus of this invention mounted on a primary printed circuit board and connected to a secondary printed circuit board.
Figure 3:
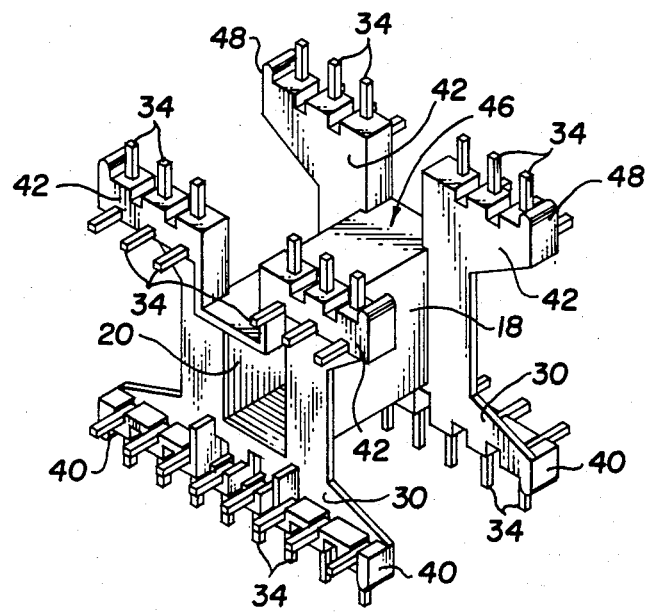
FIG. 3 is a perspective view of a bobbin for use in the apparatus of FIG. 3.
Figure 2:
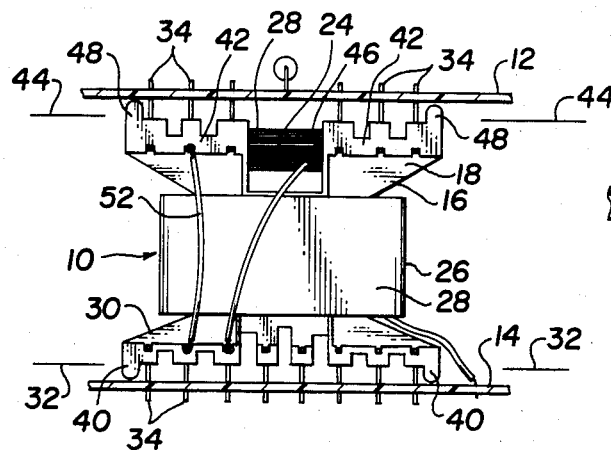
FIG. 2 is a front elevational view of the transformer, primary and secondary printed circuit board of FIG. 1.

Referring now to FIGS. 1 and 2, the reference numeral 10 generally indicates the apparatus of this invention for mounting secondary printed circuit board 12 to primary printed circuit board 14. Both the primary and secondary printed circuit boards include various electrical and electronic components mounted thereon and also various conductive paths (not shown) interconnecting the components and forming electrical circuits on the printed circuit boards. The mounting means includes transformer 16 commonly found on printed circuit boards such as the primary circuit board shown in FIGS. 1 and 2. For the purposes of this application, the term "transformer" means an electrical device which, by electromagnetic induction, transforms electrical energy from one or more circuits to one or more other circuits at the same frequency but usually at a different voltage and current value. The transformer includes bobbin 18 (shown in detail in FIG. 3) constructed of electrically insulating and non-magnetic material such as nylon or rynite. The bobbin includes cavity 20-extending therethrough for receipt of core elements 22 (shown in FIG. 1). Primary coil 24 is wound about the bobbin in a first direction and secondary coil (partially removed in FIG. 1 for the purpose of exposing core elements 22) is wound about both the bobbin and the primary coil in a second direction as is known in the art. Insulating tape 28 is applied to the exterior of the primary and secondary coils.

Figure 4:
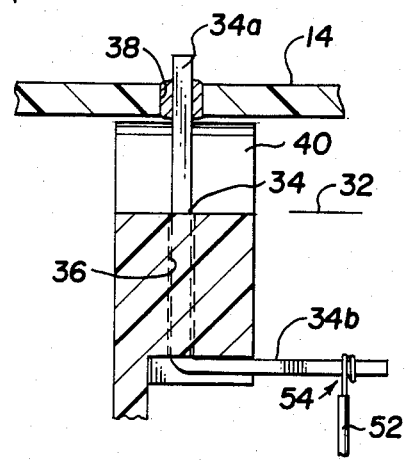
FIG. 4 is a magnified cross-sectional view of a connector pin of the apparatus of FIGS. 1 and 2.

Means are provided to mount transformer 16 on primary printed circuit board 14. The first mounting means includes a pair of flanges 30 projecting from the bobbin and defining a first surface or plane 32 in which a plurality of connector pins 34 are mounted in two parallel rows. As is shown in FIG. 4 in greater detail, each connector pin consists of an L-shaped length of rigid electrically conductive material. Preferably, each of the connector pins are pre-tinned. As is shown generally in FIG. 4, each of the connector pins is secured in a preformed receptacle 36 in one of the flanges 30 with a first leg 34a extending generally perpendicular to the first surface and a second leg 34b extending outwardly from the bobbin generally parallel to the first surface and perpendicular to first leg 34a. The connector pins may be constructed, for instance, by inserting a length of square conductive wire through a receptacle, thereby bending the wire approximately 90°, and cutting off the wire. Alternatively, the connector pin may be preformed and molded in place in the flanges. Each of the connector pins on the first surface of the bobbin is received in a like number of aligned preformed holes 38 in primary printed circuit board 14 and soldered therein such as in a flow solder operation simultaneously with the other components on primary printed circuit board 14. Standoffs 40 may be provided at one or more locations on the flanges 30 to space the primary printed circuit board a predetermined distance from the bobbin and to mechanically support the transformer on the board. In this manner the transformer is securely mounted on the primary printed circuit board.

Means are also provided to mount the transformer to secondary printed circuit board 12. The second mounting means also takes the form of four flanges 42 projecting therefrom and defining second surface or plane 44 which, in the illustrated embodiment, is parallel with first surface 32. The flanges 42 are separated into two pairs and define groove 46 in the bobbin whose purpose will be explained hereinafter. As in the case of the flanges 30 shown in detail in FIG. 4, a plurality of identical connector pins 34 are secured in a like number of preformed receptacles (not shown) in each of the flanges 42. Standoffs 48 are formed at each end of the flanges 42 to support the secondary printed circuit board and to space it a predetermined distance from the transformer. Secondary printed circuit board 12 also includes a like number of aligned preformed holes 50 (shown in FIG. 1) for receiving each of the connector pins 34 in the flanges 42 and for soldering the connector pins therein so as to securely mount the secondary printed circuit board on the transformer and thereby to mount the secondary printed circuit board on the first printed circuit board. It is one of the primary advantages of this invention that the transformer used to mount the printed circuit boards together is an existing component on one of the printed circuit boards and not an extraneous device unnecessarily occupying valuable surface area.

Means may be provided to electrically connect the transformer to the primary and secondary printed circuit boards and to connect the printed circuit boards to each other. In particular, one or more wires 52 (shown in FIG. 2 but removed from FIG. 1 for clarity) or the like are attached at each end to the laterally projecting second legs 34b of any one of the connector pins on each of the flanges 30 and 42 of the transformer bobbin. Such a connection for one end 54 of wire 52 is shown in FIG. 4 wherein the wire is wrapped about leg 34b and preferably soldered thereto. The preformed holes on the primary and secondary printed circuit boards may also be connected to the circuit paths (not shown) constructed on each of the printed circuit boards, thereby connecting the circuits on the first and second printed circuit boards to each other through the various wires 52 at desired points. The transformer is also adapted for electrical connection to either of the printed circuit boards such as by wires connected at one end to either the primary or secondary coil and at the other end to the circuits on the primary or secondary printed circuit boards, directly (as in wire 56) or through one of the connector pins 34 (as in wire 58). The transformer may thus be connected to a source of electric current and enabled to alter the voltage and/or the amperage of the electric current as is known in the art.

Figure 5:
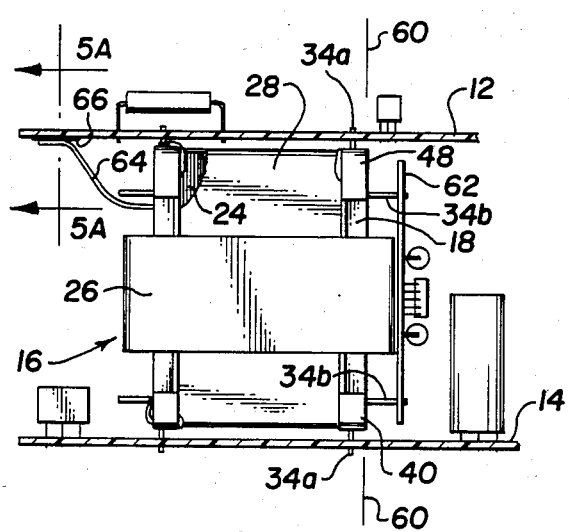
FIG. 5 is a front view of an alternative embodiment of this invention in which a tertiary printed circuit board is mounted on the transformer between the primary and secondary printed circuit boards.

FIG. 5 illustrates an alternative embodiment of the invention in which the bobbin of the transformer defines third surface 60 for mounting tertiary printed circuit board 62 on first printed circuit board 12. Although it is within the scope of the invention to provide a third set of flanges similar to the embodiment of FIGS. 1-4, in the illustrated embodiment the third surface is defined by certain of the flanges 30 and 42 on one side of the transformer bobbin. In this embodiment the connector pins 34 on the third surface of the bobbin are formed by a row of the second legs 34b of the connector pins on the flanges 30 and 42 defining the third surface. Tertiary printed circuit board 62 is connected to the bobbin by receiving each of the legs 34b connector pins on the third surface in aligned preformed holes (not shown) and in which the connector pins are soldered.

As in the case of the primary and secondary printed circuit boards, the preformed holes in which the connector pins are soldered may be connected to various circuit paths or electronic components on the tertiary printed circuit board so as to electrically connect certain of the connector pins to the circuit on the tertiary printed circuit board. Further, since the connector pins on the third surface are commonly connected to the primary and tertiary and secondary and tertiary printed circuit boards, respectively, the connector pins eliminate or reduce the need for separate interconnecting wires. However, such wires may be employed, if desired, as hereinabove described.

Figure 5A:
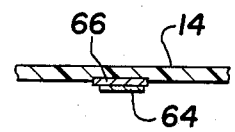
FIG. 5A is a detailed view of a conductive ribbon used to connect the transformer of FIG. 5 to one of the printed circuit boards.

FIG. 5 and FIG. 5A also show an alternative means for electrically connecting the transformer directly to one of the printed circuit boards. The alternative connection means includes flexible conductive ribbon 64 connected at one end to either the primary or secondary coils within groove 46. The ribbon extends outwardly from groove 46 and contacts conductive pad 66 formed on the secondary printed circuit board. Pad 66 is connected to the circuit on the secondary printed circuit boards and, along with one or more other connecting ribbons (not shown) similarly connected to the printed circuit boards permits electrical current to be transmitted to and from the transformer.

Although the invention has been disclosed above with regard to particular and preferred embodiments, these are advanced for illustrative purposes only and are not intended to limit the scope of this invention. For instance, it is within the scope of the invention to incline the various printed circuit boards with respect to each other and to the bobbin. Further, additional surfaces may be defined on the bobbin for supporting additional printed circuit boards. For instance, on the generally cubical transformer bobbin illustrated a total of six printed circuit boards could be accommodated by mounting additional connector pins at appropriate locations perpendicular to and on the opposite side from tertiary printed circuit board 42. Further, transformer bobbins may be employed which define less than or more than six surfaces adapted for mounting printed circuit boards as hereinabove described. These variations remain within the invention as claimed below.

What is claimed is:
1. The combination comprising:
   (a) a primary printed circuit board including a circuit;
   (b) a secondary printed circuit board including a circuit;
   (c) a transformer having a bobbin;
   (d) a plurality of circuit board supporting electrically conductive connector pins mounted in a first sur- face of said bobbin for electrical connection to said transformer, each located within a preformed hole in the primary printed circuit board and soldered therein so as to mount said transformer bobbin to said primary printed circuit board and to electrically connect said transformer to said circuit on said primary printed circuit board;

(e) a plurality of circuit board supporting electrically conductive connector pins mounted in a second surface of said bobbin for electrical connection to said transformer, each of said connector pins located within a preformed hole in said secondary printed circuit board and soldered therein so as to mount the secondary printed circuit board to said primary circuit board and to electrically connect said transformer to said circuit on said secondary printed circuit board; and (f) means for electrically interconnecting at least one pair of said connector pins on said transformer bobbin.

2. The combination of claim 1 further including a plurality of circuit board supporting electrically conductive connector pins mounted on a third surface of said bobbin for electrical connection to said transformer, each of said connector pins located within a preformed hole in a tertiary printed circuit board and soldered therein so as to mount said tertiary printed circuit board to said primary printed circuit board and to electrically connect said transformer to a circuit on said tertiary printed circuit board.

* * * * *